United States Patent
Li et al.

(10) Patent No.: US 11,652,055 B2
(45) Date of Patent: May 16, 2023

(54) INTERCONNECT STRUCTURE WITH HYBRID BARRIER LAYER

(71) Applicant: Taiwan Semiconductor Manufacturing Company, Ltd., Hsinchu (TW)

(72) Inventors: Shu-Wei Li, Hsinchu (TW); Shin-Yi Yang, New Taipei (TW); Ming-Han Lee, Taipei (TW); Shau-Lin Shue, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 6 days.

(21) Appl. No.: 17/355,566

(22) Filed: Jun. 23, 2021

(65) Prior Publication Data
US 2022/0415798 A1 Dec. 29, 2022

(51) Int. Cl.
*H01L 23/535* (2006.01)
*H01L 21/02* (2006.01)
*H01L 21/768* (2006.01)

(52) U.S. Cl.
CPC ...... *H01L 23/535* (2013.01); *H01L 21/02063* (2013.01); *H01L 21/7682* (2013.01); *H01L 21/76805* (2013.01); *H01L 21/76831* (2013.01); *H01L 21/76832* (2013.01); *H01L 21/76843* (2013.01); *H01L 21/76895* (2013.01)

(58) Field of Classification Search
CPC ............. H01L 23/535; H01L 21/02063; H01L 21/76805; H01L 21/76895; H01L 21/76831; H01L 21/76832; H01L 21/76843; H01L 21/7682
See application file for complete search history.

(56) References Cited

U.S. PATENT DOCUMENTS

| 7,427,563 B2 * | 9/2008 | Lu ..................... H01L 21/02351 257/E21.27 |
| 2006/0240187 A1 * | 10/2006 | Weidman .......... H01L 21/28556 257/E21.174 |
| 2006/0292862 A1 * | 12/2006 | Lee ................... H01L 21/28562 257/E21.171 |
| 2012/0153480 A1 * | 6/2012 | Pfuetzner .......... H01L 21/76843 257/E23.161 |
| 2017/0077037 A1 * | 3/2017 | Kelly ................ H01L 21/76802 |

OTHER PUBLICATIONS

Mackus et al. "From the Bottom-Up: Toward Area-Selective Atomic Layer Deposition with High Selectivity." Chem. Mater. 2019, 31, 2-12, published on Dec. 19, 2018.

* cited by examiner

*Primary Examiner* — Shahed Ahmed
*Assistant Examiner* — Vicki B. Booker
(74) *Attorney, Agent, or Firm* — Eschweiler & Potashnik, LLC

(57) ABSTRACT

The present disclosure relates to an integrated chip including a lower conductive wire within a first dielectric layer over a substrate. A second dielectric layer is over the first dielectric layer. A conductive via is over the lower conductive wire and within the second dielectric layer. A conductive liner layer lines sidewalls of the via. A barrier layer lines sidewalls of the conductive liner layer and lines sidewalls of the second dielectric layer. The conductive liner layer is laterally separated from the second dielectric layer by the barrier layer. The conductive liner layer vertically extends between sidewalls of the barrier layer from a bottom surface of the conductive via to a top surface of the lower conductive wire.

20 Claims, 11 Drawing Sheets

INTERCONNECT STRUCTURE WITH HYBRID BARRIER LAYER

BACKGROUND

Modern day integrated chips contain millions of semiconductor devices. The semiconductor devices are electrically interconnected by way of back-end-of-the-line (BEOL) metal interconnect layers that are formed above the devices on an integrated chip. A typical integrated chip comprises a plurality of back-end-of-the-line metal interconnect layers including different sized metal wires vertically coupled together with metal contacts (i.e., vias). A typical integrated chip also comprises a plurality of dielectric layers that electrically isolate some of the metal wires and/or vias from one another.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
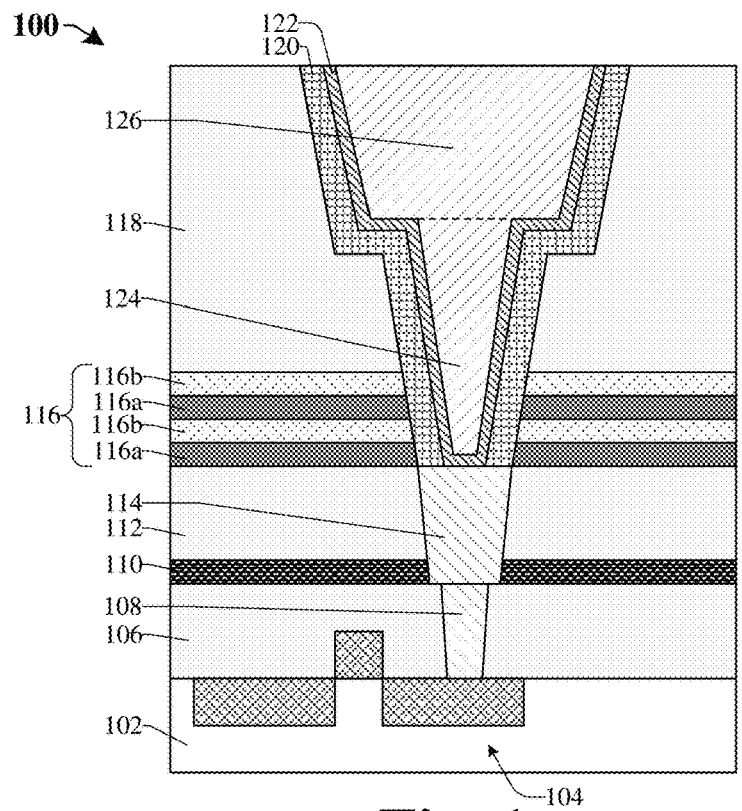
FIG. 1 illustrates a cross-sectional view of some embodiments of an integrated chip comprising a hybrid barrier layer that extends along a via and an upper wire.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Many integrated chips include metal wires and metal vias over a substrate. For example, an integrated chip may include a first dielectric layer over a substrate and a lower metal wire within the first dielectric layer. A second dielectric layer is over the first dielectric layer. A metal via is within the second dielectric layer and is directly over the lower metal wire. A conductive liner layer lines the metal via. Further, a barrier layer lines the conductive liner layer and also lines the second dielectric layer.

Further, the integrated chip is formed by a number of processes. For example, the lower metal wire is formed over the substrate and within the first dielectric layer. The second dielectric layer is formed over the first dielectric layer. The second dielectric layer is patterned to form a via opening in the second dielectric layer. A plasma pre-clean process is performed in the via opening and on a top surface of the lower metal wire to remove any residue or other impurities from the via opening and/or the top surface of the lower metal wire before proceeding. The barrier layer is then formed on the top surface of the lower metal wire and on sidewalls of the second dielectric layer that define the via opening. Next, the conductive liner layer is formed over the barrier layer and lining the barrier layer. Finally, the metal via is formed over the conductive liner layer in the remainder of the via opening.

However, performing the plasma pre-clean process may damage the second dielectric layer, thereby reducing a reliability (e.g., a time-dependent dielectric breakdown (TDDB)) of the second dielectric layer and/or an insulating ability of the second dielectric layer. As a result, a performance of the integrated chip may be reduced.

Further, the barrier layer typically has a larger resistance than the metal via. The larger resistance of the barrier layer can increase a resistance between the metal via and the lower metal wire. Thus, a performance of the integrated chip may be further reduced.

Various embodiments of the present disclosure are related to an integrated chip comprising a hybrid barrier layer for improving a performance of the integrated chip. The integrated chip comprises a substrate and a first dielectric layer over the substrate. A lower wire is within the first dielectric layer. A second dielectric layer is over the first dielectric layer. A via is over the lower wire and is within the second dielectric layer. A liner layer lines sidewalls of the via and a bottom surface of the via. Further, the liner layer is on a top surface of the lower wire. The hybrid barrier layer lines sidewalls of the liner layer and sidewalls of the second dielectric layer, but does not extend between a top surface of the lower wire and a bottom surface of the via. Further, the hybrid barrier layer comprises one or more metals, one or more dielectrics, and one or more ligands. Furthermore, a thickness of the hybrid barrier layer is small (e.g., about 6 to 200 angstroms).

Various embodiments of the present disclosure are also related to a method for forming the integrated chip comprising the hybrid barrier layer. The method comprises patterning the second dielectric layer to form a via opening over the lower wire. A blocking layer is then formed on the top surface of the lower wire. A barrier precursor layer is then formed on the sidewalls of the second dielectric layer that define the via opening. The barrier precursor layer comprises a metal-ligand material. A dielectric liner layer is then formed on sidewalls of the barrier precursor layer. The blocking layer prevents the barrier precursor layer and the dielectric liner layer from being formed on the lower wire. A plasma pre-clean process is then performed on the dielectric liner layer, the barrier precursor layer, and the blocking layer. The plasma treatment process removes the blocking layer from the top surface of the lower wire. The plasma treatment process also dissociates the metal-ligand material of the blocking layer to form the hybrid barrier layer from the barrier precursor layer and the dielectric liner layer. The metal from the metal-ligand material and the dielectric liner layer react to form the hybrid barrier layer. Further, the ligands from the metal-ligand material react with the dielectric liner layer and the second dielectric layer and may repair damage caused to those layers by the plasma pre-clean process (e.g., the ligands may fill portions of said layers that were removed by the plasma pre-clean process). The liner layer is then formed over the hybrid barrier layer and on the top surface of the lower wire. A via is then formed over the conductive liner layer in the via opening.

Because the ligands may react with the second dielectric layer to repair damage caused to the second dielectric layer by the pre-clean process, a reliability (e.g., a time-dependent dielectric breakdown (TDDB)) of the second dielectric layer and/or an insulating ability of the second dielectric layer may be improved. As a result, a performance of the integrated chip may be improved.

Further, because the hybrid barrier layer has a small thickness, the hybrid barrier layer may consume a small portion of the via opening. Thus, a volume of the via may be increased. In turn, a resistivity of the via may be reduced. For example, a sheet resistance of the via may be reduced. Thus, a performance of the integrated chip may be further improved.

Furthermore, because the hybrid barrier layer is not between the lower wire and the via, a contact resistance between the via and the lower wire may be reduced. Thus, a performance of the integrated chip may be further improved.

FIG. 1 illustrates a cross-sectional view 100 of some embodiments of an integrated chip comprising a hybrid barrier layer 120 that extends along a via 124 and an upper wire 126.

The integrated chip comprises a substrate 102 and a semiconductor device 104 along the substrate 102. A base dielectric layer 106 is over the substrate 102 and a contact 108 extends through the base dielectric layer 106 to the underlying semiconductor device 104. Further, a base etch-stop layer 110 is over the base dielectric layer 106.

A first dielectric layer 112 is over the base etch-stop layer 110. A lower wire 114 is within the first dielectric layer 112 and within the base etch-stop layer 110. A first etch-stop layer 116 is over the first dielectric layer 112. The first etch-stop layer 116 may, for example, comprise a plurality of materials (e.g., 116a, 116b). For example, the first etch-stop layer 116 may comprise an alternating stack of a first etch-stop material 116a and a second etch-stop material 116b different from the first etch-stop material 116a.

A second dielectric layer 118 is over the first etch-stop layer 116. A via 124 is within the second dielectric layer 118 and the first etch-stop layer 116. The via 124 is over the lower wire 114. An upper wire 126 is within the second dielectric layer 118 and is over the via 124. In some embodiments, the via 124 is in direct contact with the upper wire 126. In some other embodiments, the via 124 and the upper wire 126 comprise a same, continuous material.

A liner layer 122 lines the via 124 and the upper wire 126. For example, the liner layer 122 is on sidewalls of the via 124, a bottom surface of the via 124, sidewalls of the upper wire 126, and a lower surface of the upper wire 126. The liner layer 122 is also on a top surface of the lower wire 114.

The hybrid barrier layer 120 lines the liner layer 122, the second dielectric layer 118, and the first etch-stop layer 116. For example, the hybrid barrier layer 120 is on sidewalls of the liner layer 122, a lower surface of the liner layer 122, sidewalls of the second dielectric layer 118, an upper surface of the second dielectric layer 118, and sidewalls of the first etch-stop layer 116. In some embodiments, the hybrid barrier layer 120 is also on a top surface of the lower wire 114. However, the hybrid barrier layer 120 is not arranged between the top surface of the lower wire 114 and the bottom surface of the via 124. Because the hybrid barrier layer 120 is not between the top surface of the lower wire 114 and the bottom surface of the via 124, a contact resistance between the via 124 and the lower wire 114 may be reduced. Thus, a performance of the integrated chip may be improved.

In some embodiments, the liner layer 122 is laterally separated from the second dielectric layer 118 by the hybrid barrier layer 120. In some embodiments, the liner layer 122 vertically extends between sidewalls of the hybrid barrier layer 120 from a bottom surface of the via 124 to the top surface of the lower wire 114. In some embodiments, an upper surface of the liner layer 122 is in direct contact with the bottom surface of the via 124, and a lower surface of the liner layer 122, opposite the upper surface, is in direct contact with the top surface of the lower wire 114.

In some embodiments, the hybrid barrier layer 120 comprises one or more metals, one or more dielectrics, and one or more ligands. For example, in some embodiments, the hybrid barrier layer 120 may comprise a compound that includes tin, silicon dioxide, and bis(trimethylsilyl)amine. In some embodiments, ligands from the hybrid barrier layer 120 are within the second dielectric layer 118. The ligands may be filling regions of the second dielectric layer 118 where voids once existed within and/or along surfaces of the second dielectric layer 118. For example, a plasma pre-clean process performed during the formation of the integrated chip may damage the second dielectric layer 118 (e.g., may create voids within and/or along surfaces of the second dielectric layer 118), and ligands from the hybrid barrier layer may react with the second dielectric layer 118 and repair that damage (e.g., may fill the voids). Because ligands from the hybrid barrier layer 120 may be within the second dielectric layer 118 filling voids within and/or along the second dielectric layer 118, a reliability (e.g., a time-dependent dielectric breakdown (TDDB)) of the second dielectric layer 118 and/or an insulating ability of the second dielectric layer 118 may be improved. As a result, a performance of the integrated chip may be further improved.

Further, in some embodiments, a thickness of the hybrid barrier layer 120 is small. For example, the thickness of the hybrid barrier layer 120 may be about 6 to 200 angstroms, about 6 to 100 angstroms, or some other suitable value. Because the hybrid barrier layer 120 has a small thickness, a volume of the via 124 and/or the upper wire 126 may be increased. In turn, a resistivity of the via 124 and/or the upper wire 126 may be reduced. For example, a sheet resistance of the via 124 and/or the upper wire 126 may be reduced. Thus, a performance of the integrated chip may be further improved.

Although items 114, 124, and 126 are referred to as wires and vias, it will be appreciated that said items may alternatively be some other form of interconnect and thus may alternatively be generically referred to as interconnect.

Figure 2:
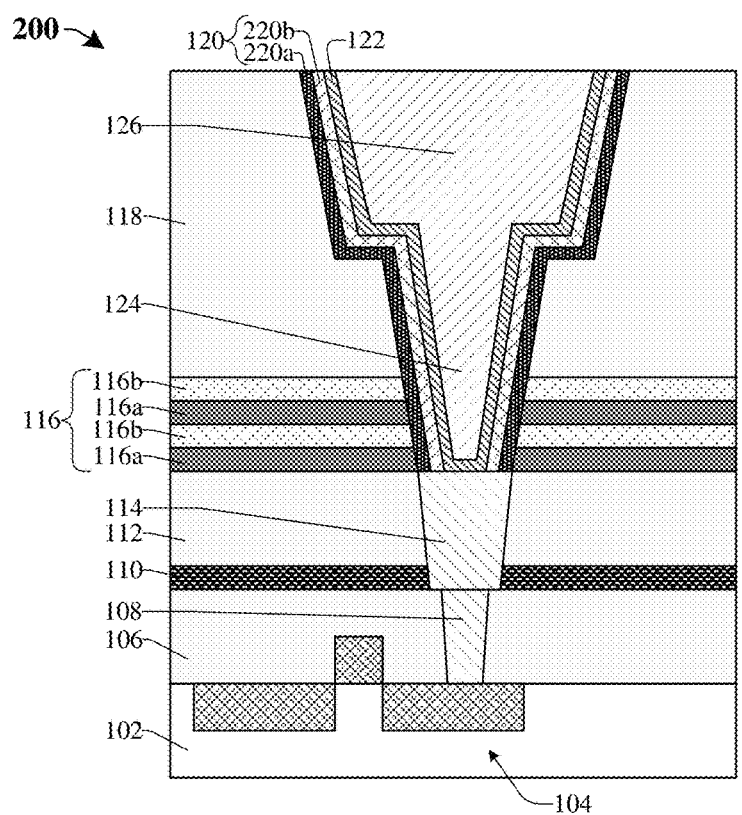
FIG. 2 illustrates a cross-sectional view of some embodiments of an integrated chip comprising a hybrid barrier layer having a first barrier layer and a second barrier layer.

FIG. 2 illustrates a cross-sectional view 200 of some embodiments of an integrated chip comprising a hybrid barrier layer 120 having a first barrier layer 220a and a second barrier layer 220b.

In such embodiments, the second barrier layer 220b is over the first barrier layer 220a and the second barrier layer 220b lines the first barrier layer 220a. In some embodiments, the first barrier layer 220a may comprise any of one or more metals, one or more dielectrics, and one or more ligands, while the second barrier layer 220b may comprise one or more dielectrics and one or more ligands.

Figure 17:
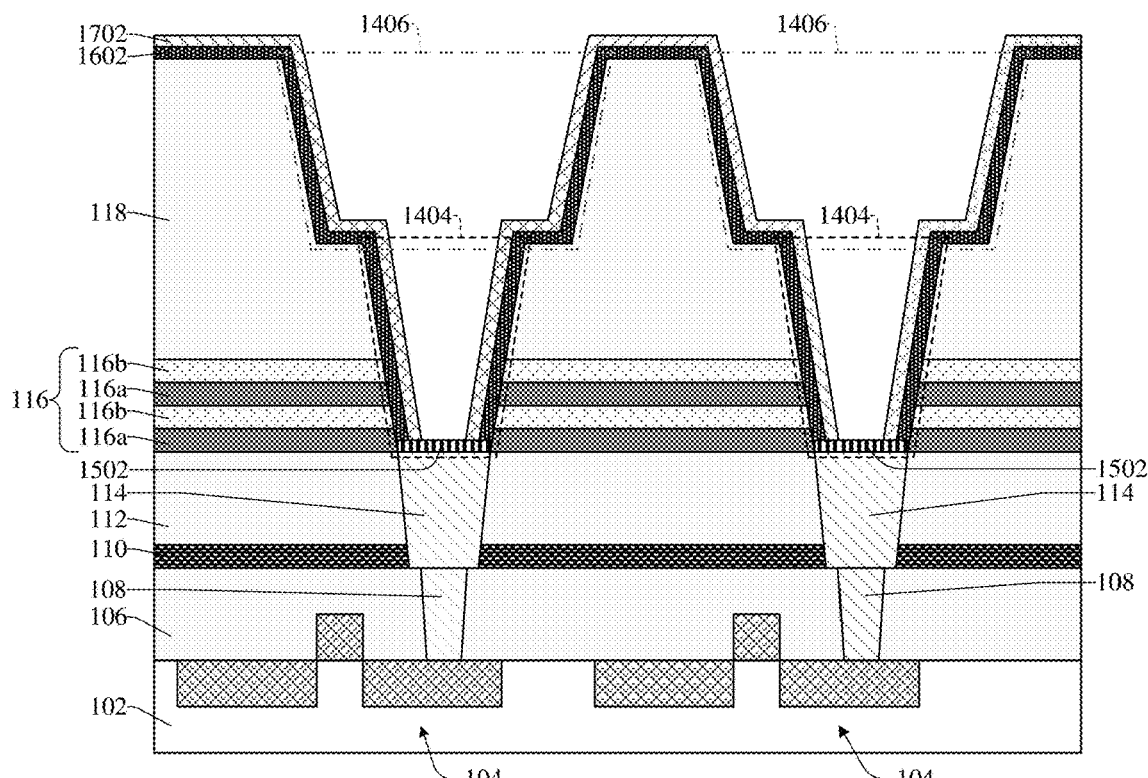
Figure 18:
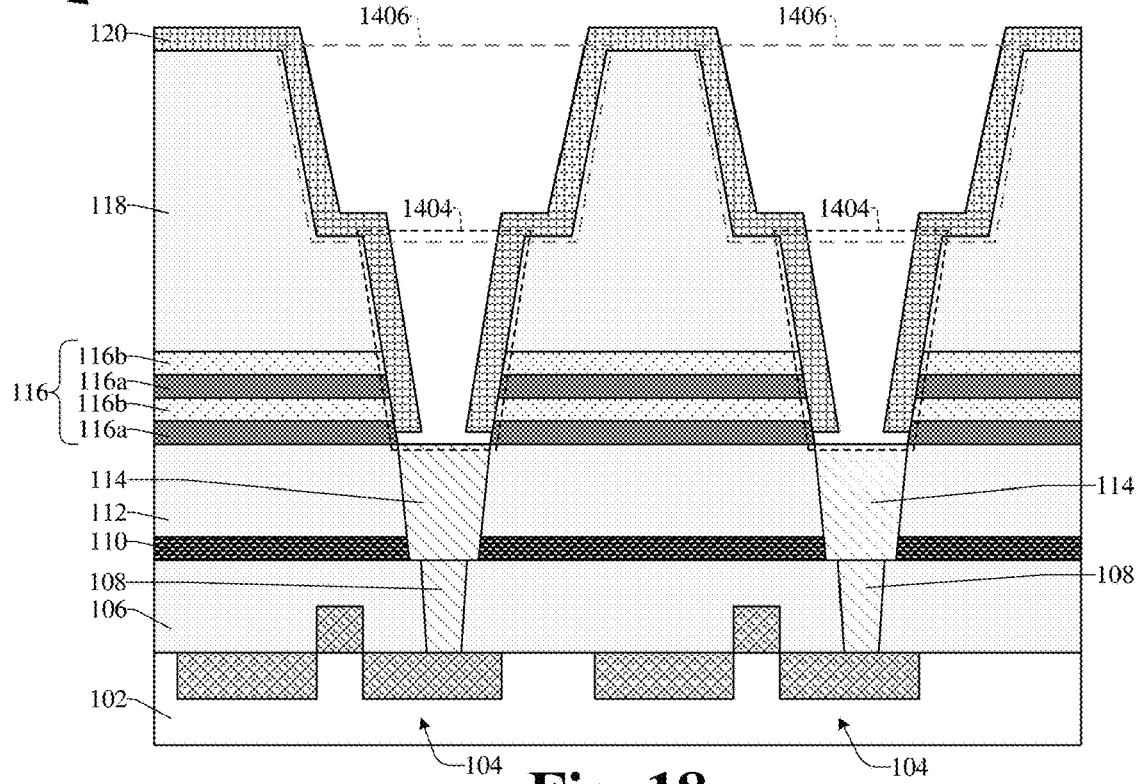

In some embodiments, the second barrier layer 220b may have a different composition than the first barrier layer 220a (e.g., the second barrier layer 220b may not comprise the one or more metals) because the one or more metals of the first barrier layer 220a may not diffuse into the second barrier layer 220b during a hybrid barrier layer 120 formation process (see for example, FIGS. 17 and 18).

Figure 3:
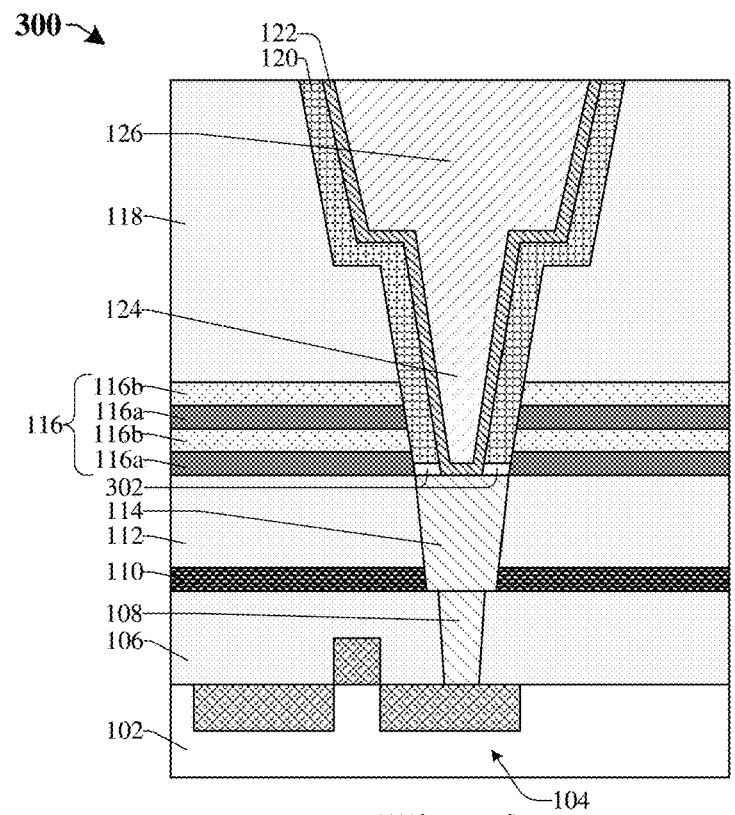
FIG. 3 illustrates a cross-sectional view of some embodiments of an integrated chip comprising a hybrid barrier layer that is separated from a lower wire by cavities.

FIG. 3 illustrates a cross-sectional view 300 of some embodiments of an integrated chip comprising a hybrid barrier layer 120 that is separated from a lower wire 114 by cavities 302.

In such embodiments, the cavities 302 are vertically between a top surface of the lower wire 114 and lower surfaces of the hybrid barrier layer 120. The cavities 302 may also laterally separate a liner layer 122 from a first etch-stop layer 116 and/or from a second dielectric layer 118. In some embodiments, the cavities 302 may, for example, comprise air, some other gas, or the like. In some embodiments, the cavities 302 are defined by lower surfaces of the hybrid barrier layer 120 and a top surface of the lower wire 114.

In some embodiments, the cavities 302 exist between the lower wire 114 and the hybrid barrier layer 120 due to a blocking layer (e.g. 1502 of FIG. 15) being formed on the top surface of the lower wire 114 before the hybrid barrier layer 120 is formed, the hybrid barrier layer 120 being subsequently formed on top of the blocking layer, and the blocking layer being subsequently removed from between the hybrid barrier layer 120 and the lower wire 114 before the liner layer 122 is formed (see, for example, FIGS. 15 to 18).

Moreover, in some embodiments, the liner layer 122 is on the top surface of the lower wire 114 while the hybrid barrier layer 120 is not because the blocking layer is removed from the top surface of the lower wire 114 before liner layer 122 is formed.

Figure 4:
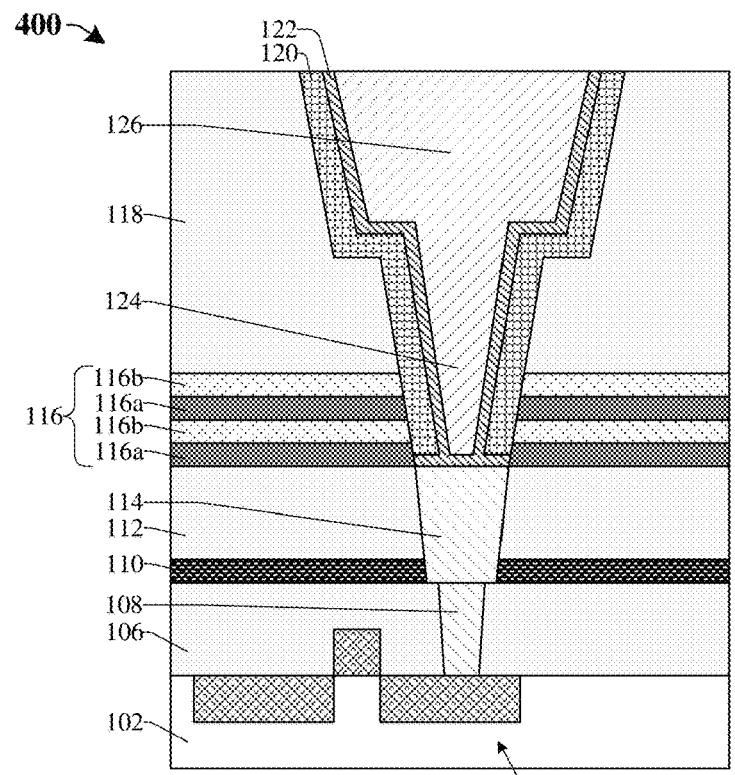
FIG. 4 illustrates a cross-sectional view of some embodiments of an integrated chip comprising a hybrid barrier layer that is separated from a lower wire by a liner layer.

FIG. 4 illustrates a cross-sectional view 400 of some embodiments of an integrated chip comprising a hybrid barrier layer 120 that is separated from a lower wire 114 by a liner layer 122.

In such embodiments, the liner layer 122 extends below the hybrid barrier layer 120 to vertically between a top surface of the lower wire 114 and a lower surface of the hybrid barrier layer 120. In some embodiments, the liner layer 122 is on sidewalls of a first etch-stop layer 116.

In some embodiments, the liner layer 122 is between the lower wire 114 and the hybrid barrier layer 120 due to a blocking layer (e.g. 1502 of FIG. 15) being formed on the top surface of the lower wire 114 before the hybrid barrier layer 120 is formed, the hybrid barrier layer 120 being subsequently formed on top of the blocking layer, the blocking layer being subsequently removed from between the hybrid barrier layer 120 and the lower wire 114, and the liner layer 122 being subsequently formed over the hybrid barrier layer 120 and between the hybrid barrier layer 120 and the lower wire 114 where the blocking layer was previously arranged (see, for example, FIGS. 15 to 18). In other words, cavities (e.g., 302 of FIG. 3) may exist between the hybrid barrier layer 120 and the lower wire 114 after the blocking layer is removed, and the liner layer 122 may fill those cavities when the liner layer 122 is subsequently formed over the hybrid barrier layer 120.

Figure 5:
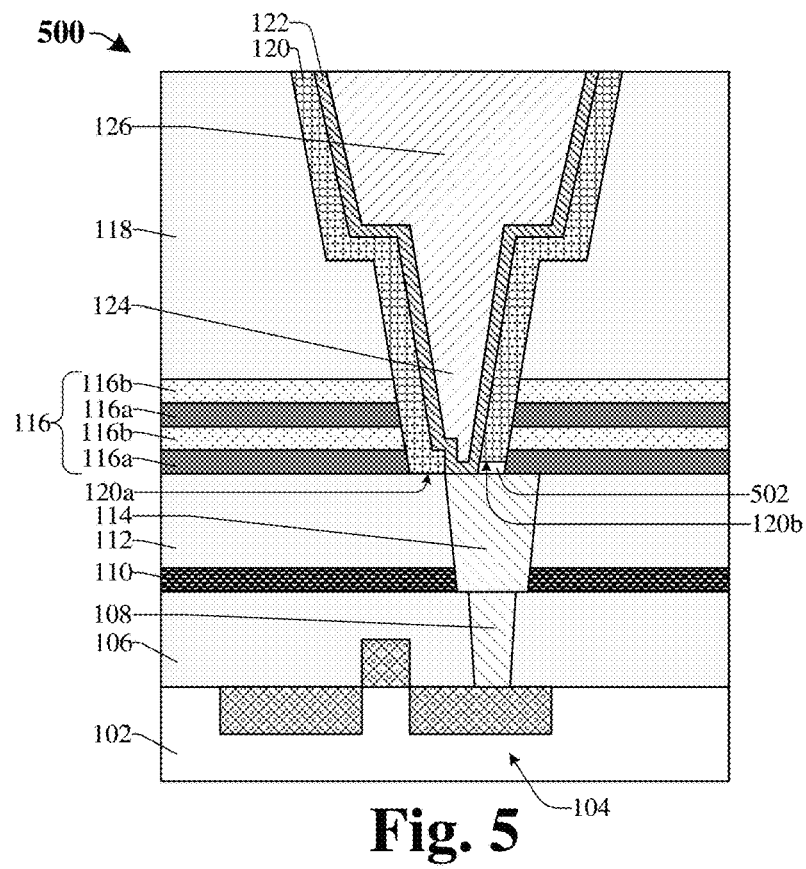
FIGS. 5-8 illustrate cross-sectional views of some embodiments of an integrated chip comprising a hybrid barrier on a top surface of a first dielectric layer.

FIG. 5 illustrates a cross-sectional view 500 of some embodiments of an integrated chip comprising a hybrid barrier layer 120 on a top surface of a first dielectric layer 112.

In such embodiments, a first lower surface 120a of the hybrid barrier layer 120 is directly over the first dielectric layer and a second lower surface 120b of the hybrid barrier layer 120 is directly over the lower wire 114. In some embodiments, the first lower surface 120a is on the top surface of the first dielectric layer 112 and the second lower surface 120b is vertically separated from a top surface of the lower wire 114 by a cavity 502. Further, in some embodiments, the first lower surface 120a is laterally separated from the second lower surface 120b by a liner layer 122.

In some embodiments, the hybrid barrier layer 120 is on the top surface of the first dielectric layer 112 because a via 124 is laterally offset from an underlying lower wire 114 (e.g., a first axis that is aligned with a center of the via 124 is laterally spaced apart from a second axis that is aligned with a center of the lower wire 114). Further, in some embodiments, the via 124 is laterally offset from the lower wire 114 by a distance that is greater than, or equal to, a thickness of the hybrid barrier layer 120. In some embodiments, the offset may be the result of a misalignment in a patterning of the second dielectric layer 118 when forming a via opening in the second dielectric layer 118.

In some embodiments, a blocking layer (e.g. 1502 of FIG. 15) is formed onto the lower wire 114 prior to forming the hybrid barrier layer 120. In such embodiments, the blocking layer will prevent the hybrid barrier layer 120 from forming on the lower wire 114. In some embodiments, the misalignment in the patterning of the second dielectric layer 118, in conjunction with the blocking layer, will result in the hybrid barrier layer 120 having a horizontally extending surface that protrudes outward from a sidewall of the hybrid barrier layer 120. In such embodiments, the liner layer 122 may have a bottom with a stepped profile.

Figure 6:
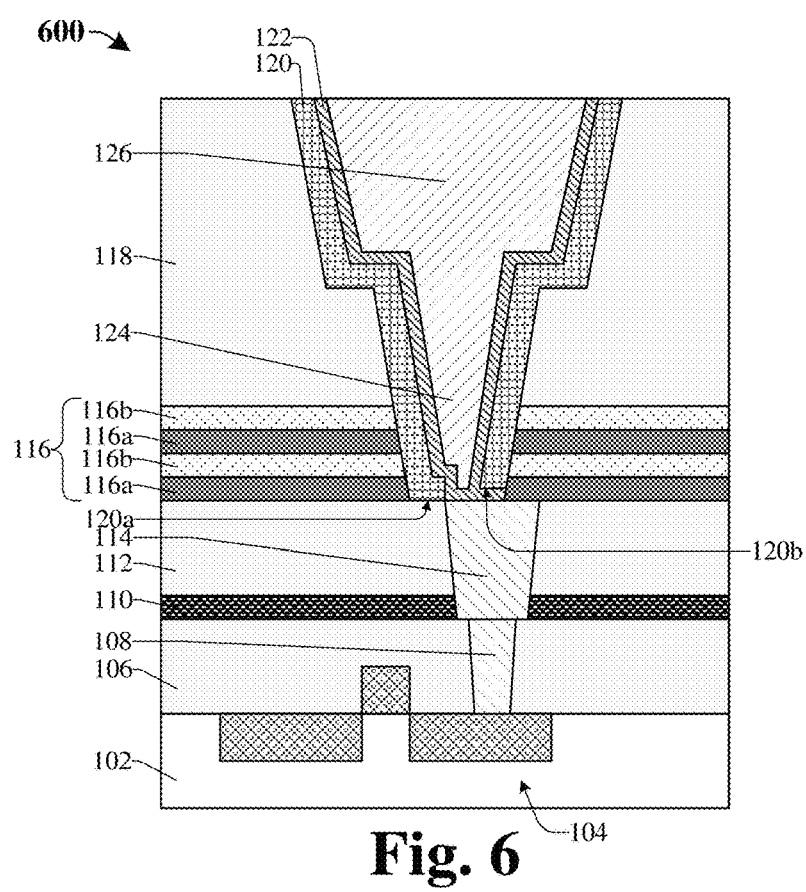

FIG. 6 illustrates a cross-sectional view 600 of some other embodiments of an integrated chip comprising a hybrid barrier layer 120 on a top surface of a first dielectric layer 112.

In such embodiments, a first lower surface 120a of the hybrid barrier layer 120 is on the top surface of the first dielectric layer 112 and a second lower surface 120b of the hybrid barrier layer 120 is vertically separated from a top surface of the lower wire 114 by a liner layer 122.

In addition, in some embodiments, a metal composition of the hybrid barrier layer 120 decreases along a thickness of the hybrid barrier layer 120. For example, the hybrid barrier layer 120 may have a higher metal composition along the second dielectric layer 118 and/or the first etch-stop layer 116 than along the liner layer 122. This gradient metal composition may exist because a rate at which a metal diffuses through a dielectric liner layer (e.g., 1702 of FIG.

17) during a formation of the hybrid barrier layer 120 (see, for example, FIGS. 17 and 18) is low. In some other embodiments, a metal composition of the hybrid barrier layer 120 is uniform along the thickness of the hybrid barrier layer 120. This may be because the rate at which the metal diffuses through the dielectric liner layer (e.g., 1702 of FIG. 17) during the formation of the hybrid barrier layer 120 is high.

Figure 7:
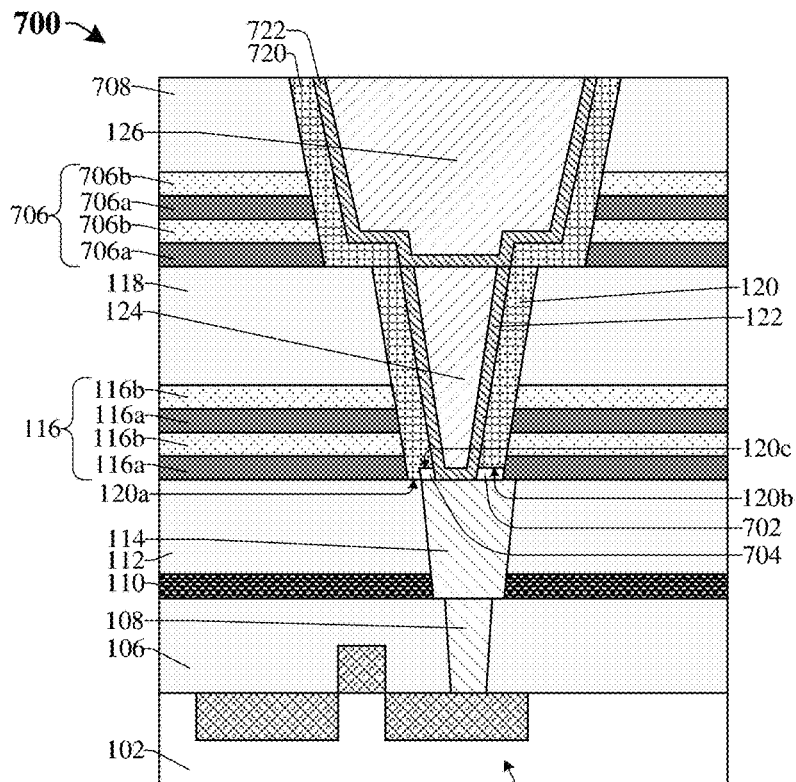

FIG. 7 illustrates a cross-sectional view 700 of some other embodiments of an integrated chip comprising a hybrid barrier layer 120 on a top surface of a first dielectric layer 112.

In such embodiments, a first lower surface 120a of the hybrid barrier layer 120 is directly over the first dielectric layer, a second lower surface 120b of the hybrid barrier layer 120 is directly over the lower wire 114, and a third lower surface 120c of the hybrid barrier layer 120 is directly over the lower wire 114. The first lower surface 120a is on the top surface of the first dielectric layer 112. The second lower surface 120b is vertically separated from a top surface of the lower wire 114 by a first cavity 702. The third lower surface 120c is vertically separated from a top surface of the lower wire 114 by a second cavity 704. Further, the first lower surface 120a and the third lower surface 120c are laterally separated from the second lower surface 120b by a liner layer 122.

In some embodiments, the hybrid barrier layer 120 is on the top surface of the first dielectric layer 112 because a via 124 is laterally offset from an underlying lower wire 114. Further, in some embodiments, the via 124 is laterally offset from the lower wire 114 by a distance that is less than a thickness of the hybrid barrier layer 120.

In addition, in some embodiments, the integrated chip may further comprise a second etch-stop layer 706 over the second dielectric layer 118, a third dielectric layer 708 over the second etch-stop layer 706, and additional hybrid barrier layer 720 over the second dielectric layer 118, and an additional liner layer 722 over the additional hybrid barrier layer 720. In such embodiments, the via 124 is within the first etch-stop layer 116 and the second dielectric layer 118 while the upper wire 126 is within the second etch-stop layer 706 and the third dielectric layer 708. Further, in some embodiments, the additional liner layer 722 lines the upper wire 126 and the additional hybrid barrier layer 720 lines the additional liner layer 722. In some embodiments, the additional liner layer 722 vertically separates the upper wire 126 from the via 124.

In some embodiments, the additional hybrid barrier layer 720 is on a top surface of the second dielectric layer 118 and on a top surface of the hybrid barrier layer 120, but does not extend over a top surface of the liner layer 122 nor over a top surface of the via 124. Further, in some embodiments, the additional liner layer 722 is on the top surface of the liner layer 122 and on the top surface of the via 124.

In some embodiments, the integrated chip may comprise the second etch-stop layer 706, the third dielectric layer 708, the additional hybrid barrier layer 720, and the additional liner layer 722 because a single damascene process may be used when forming the via 124 and the upper wire 126 instead of a dual damascene process.

Figure 8:
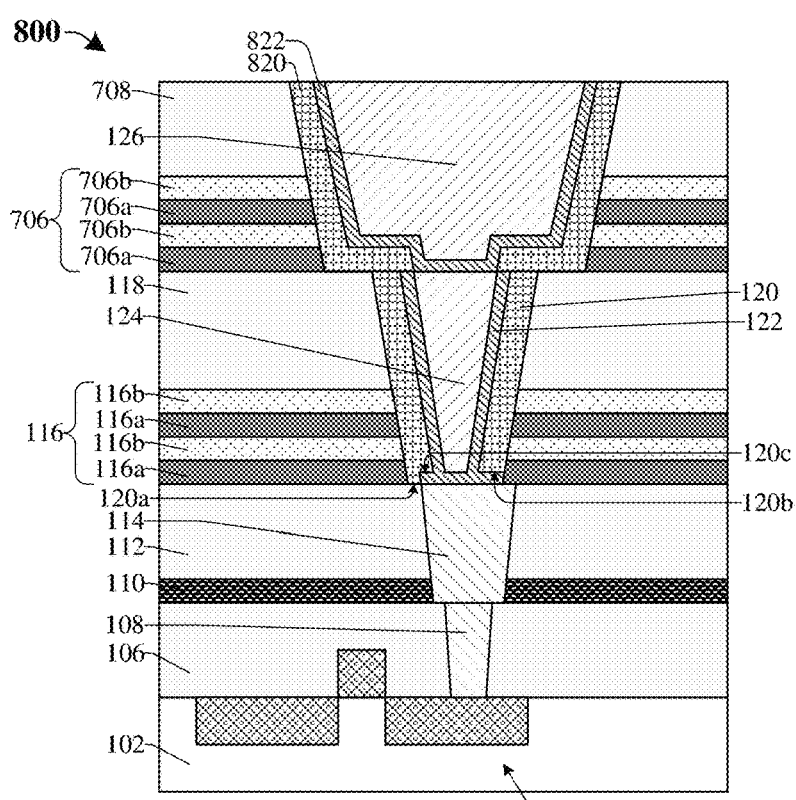

FIG. 8 illustrates a cross-sectional view 800 of some other embodiments of an integrated chip comprising a hybrid barrier layer 120 on a top surface of a first dielectric layer 112.

In such embodiments, a first lower surface 120a is on the top surface of the first dielectric layer 112. A second lower surface 120b is vertically separated from a top surface of the lower wire 114 by a liner layer 122. The third lower surface 120c is also vertically separated from a top surface of the lower wire 114 by the liner layer 122.

In addition, in some embodiments, an additional barrier layer 820 is on a top surface of the second dielectric layer 118, on a top surface of the hybrid barrier layer 120, and on a top surface of the liner layer 122, but does not extend over a top surface of the via 124. Further, in some embodiments, an additional liner layer 822 is on the top surface of the via 124.

In some embodiments, the substrate 102 may, for example, be or comprise silicon, some III-V material, some other semiconductor material, or the like.

In some embodiments, the semiconductor device 104 may, for example, be or comprise a metal-oxide-semiconductor field-effect transistor (MOSFET), a bipolar junction transistor (BJT), a junction field-effect transistors (JFET), a fin field-effect transistors (FinFET), a gate-all-around field-effect transistors (GAA FET), some other suitable semiconductor device(s), or the like.

In some embodiments, any of the base dielectric layer 106, the first dielectric layer 112, the second dielectric layer 118, and the third dielectric layer 708 may, for example, comprise any of silicon dioxide, silicon nitride, silicon carbide, silicon oxycarbide, silicon oxycarbonitride, silicon carbonitride, silicon oxynitride, some SiOCH film, some other low-k dielectric, or some other suitable material.

In some embodiments, any of the contact 108, the lower wire 114, the via 124, and the upper wire 126 may, for example, comprise any of copper, cobalt, tungsten, ruthenium, molybdenum, some other metal, graphene, or some other conductive material.

In some embodiments, any of the base etch-stop layer 110, the first etch-stop layer 116 (e.g., any of the first etch-stop material 116a and the second etch-stop material 116b), and the second etch-stop layer 706 (e.g., any of the third etch-stop material 706a and the fourth etch-stop material 706b) may, for example, comprise any of silicon carbide, silicon nitride, aluminum oxide, aluminum nitride, aluminum oxynitride, or some other suitable material. For example, in some embodiments, the first etch-stop layer 116 and/or the second etch-stop layer 706 may comprise an alternating stack of silicon carbide and aluminum oxide or some other suitable materials.

In some embodiments, the liner layer 122 may, for example, comprise any of cobalt, ruthenium, manganese, zinc, zirconium, tungsten, molybdenum, osmium, iridium, aluminum, iron, nickel, some other metal, some other conductive material, or the like.

In some embodiments, the hybrid barrier layer 120 may comprise any of manganese, zinc, chromium, aluminum, gold, indium, titanium, magnesium, vanadium, zirconium, tin, some other metal, silicon dioxide, silicon nitride, silicon carbide, silicon oxycarbide, silicon oxycarbonitride, silicon carbonitride, silicon oxynitride, some SiOCH film, some other dielectric, hexamethyldisilazane (HDMS), trimethylsilylacetylene (TMSA), trimethylsilylamine, or some other suitable material.

FIGS. 9-21 illustrate cross-sectional views 900-2100 of some embodiments of a method for forming an integrated chip comprising a hybrid barrier layer 120 that extends along a via 124. Although FIGS. 9-21 are described in relation to a method, it will be appreciated that the structures disclosed in FIGS. 9-21 are not limited to such a method, but instead may stand alone as structures independent of the method.

Figure 9:
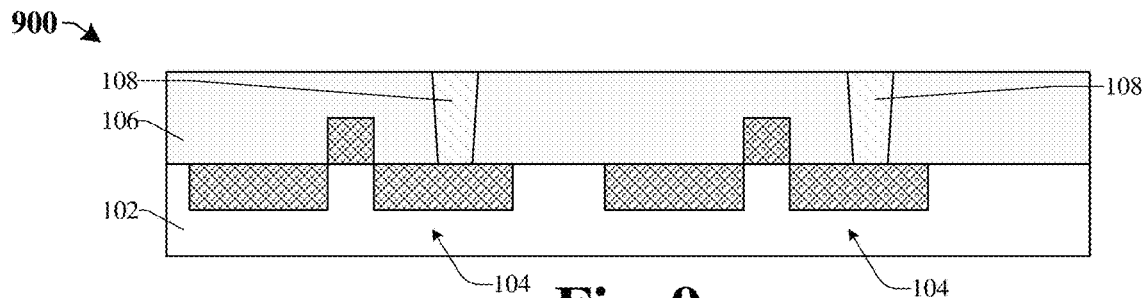
FIGS. 9-21 illustrate cross-sectional views of some embodiments of a method for forming an integrated chip comprising a hybrid barrier layer that extends along a via.

As shown in cross-sectional view 900 of FIG. 9, a plurality of semiconductor devices 104 are formed along a substrate 102. Further, a base dielectric layer 106 is formed over the substrate 102. Furthermore, a plurality of contacts 108 are formed within the base dielectric layer 106 and over the plurality of semiconductor devices 104.

In some embodiments, the plurality of semiconductor devices 104 may, for example, be formed by one or more of an ion implantation process, a deposition process, a patterning process, or some other suitable process(es).

In some embodiments, the base dielectric layer 106 may, for example, be formed by depositing any of silicon dioxide, silicon nitride, silicon carbide, silicon oxycarbide, silicon oxycarbonitride, silicon carbonitride, silicon oxynitride, some SiOCH film, some other low-k dielectric, or some other suitable material over the substrate 102 by any of a chemical vapor deposition (CVD) process, a physical vapor deposition (PVD) process, an atomic layer deposition (ALD) process, a spin on process, or some other suitable process.

In some embodiments, the plurality of contacts 108 may, for example, be formed by patterning the base dielectric layer 106 to form contact openings in the base dielectric layer 106, by depositing metal in the contact openings, and by performing a planarization process on the metal.

Figure 10:
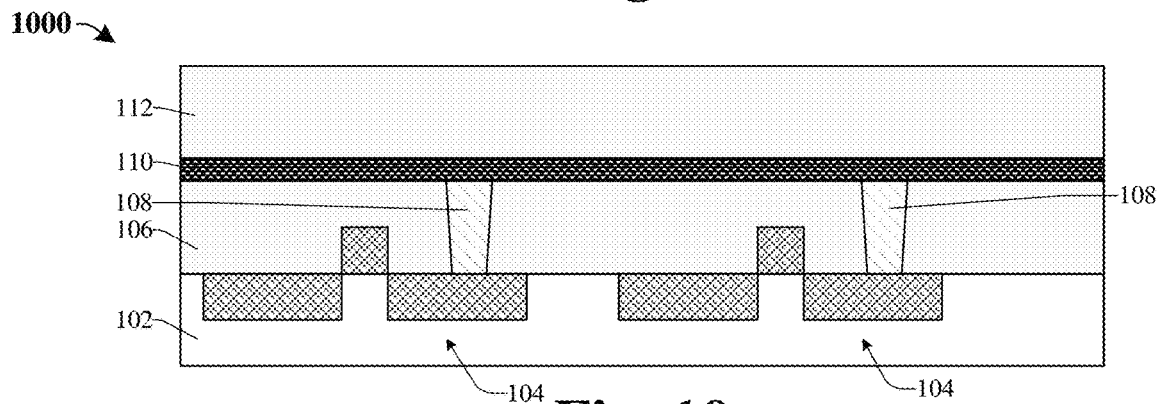

As shown in cross-sectional view 1000 of FIG. 10, a base etch-stop layer 110 is formed over the base dielectric layer 106 and a first dielectric layer 112 is formed over the base etch-stop layer 110.

In some embodiments, the base etch-stop layer 110 may, for example, be formed by depositing any of silicon carbide, silicon nitride, aluminum oxide, aluminum nitride, aluminum oxynitride, or some other suitable material over the substrate 102 by any of a CVD process, a PVD process, an ALD process, a spin on process, or some other suitable process.

In some embodiments, the first dielectric layer 112 may, for example, be formed by depositing any of silicon dioxide, silicon nitride, silicon carbide, silicon oxycarbide, silicon oxycarbonitride, silicon carbonitride, silicon oxynitride, some SiOCH film, some other low-k dielectric, or some other suitable material over the substrate 102 by any of a CVD process, a PVD process, an ALD process, a spin on process, or some other suitable process.

Figure 11:
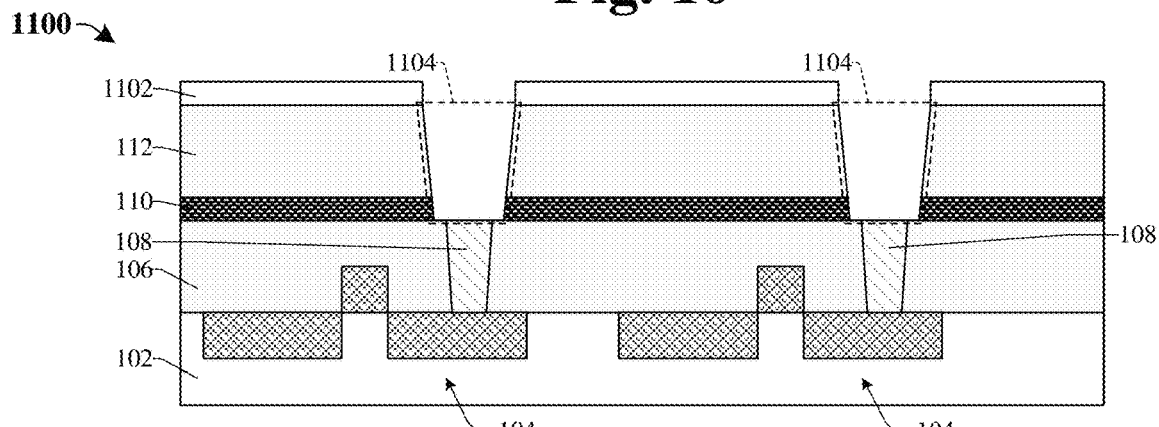

As shown in cross-sectional view 1100 of FIG. 11, a first mask 1102 is formed over the first dielectric layer 112. Further, the first dielectric layer 112 and the base etch-stop layer 110 are patterned according to the first mask 1102 to form a plurality of lower wire openings 1104 in the first dielectric layer 112 and in the base etch-stop layer 110. The plurality of lower wire openings 1104 are defined by sidewalls of the first dielectric layer 112 and by sidewalls of the base etch-stop layer 110.

In some embodiments, the patterning may, for example, comprise a dry etching process or some other suitable process. For example, the patterning may comprise a reactive ion etching (RIE) process, an ion beam etching (IBE) process, or some other suitable process.

In some embodiments, the first mask 1102 may, for example, comprise any of photoresist, titanium nitride, or some other suitable material.

Figure 12:
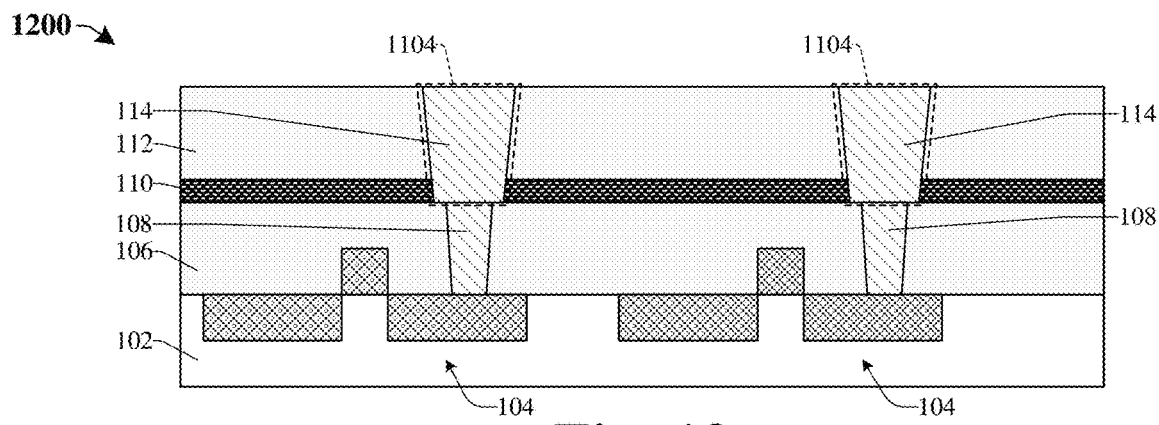

As shown in cross-sectional view 1200 of FIG. 12, a plurality of lower wires 114 are formed within the first dielectric layer 112 and the base etch-stop layer 110 in the plurality of lower wire openings 1104.

In some embodiments, the plurality of lower wires 114 may, for example, be formed by depositing any of copper, cobalt, tungsten, ruthenium, molybdenum, some other metal, graphene, or some other conductive material over the substrate 102 by any of a sputtering process, an electro-chemical plating (ECP) process, an electroless deposition (ELD) process, a CVD process, a PVD process, an ALD process, or some other suitable process, and by subsequently performing a planarization process.

Figure 13:
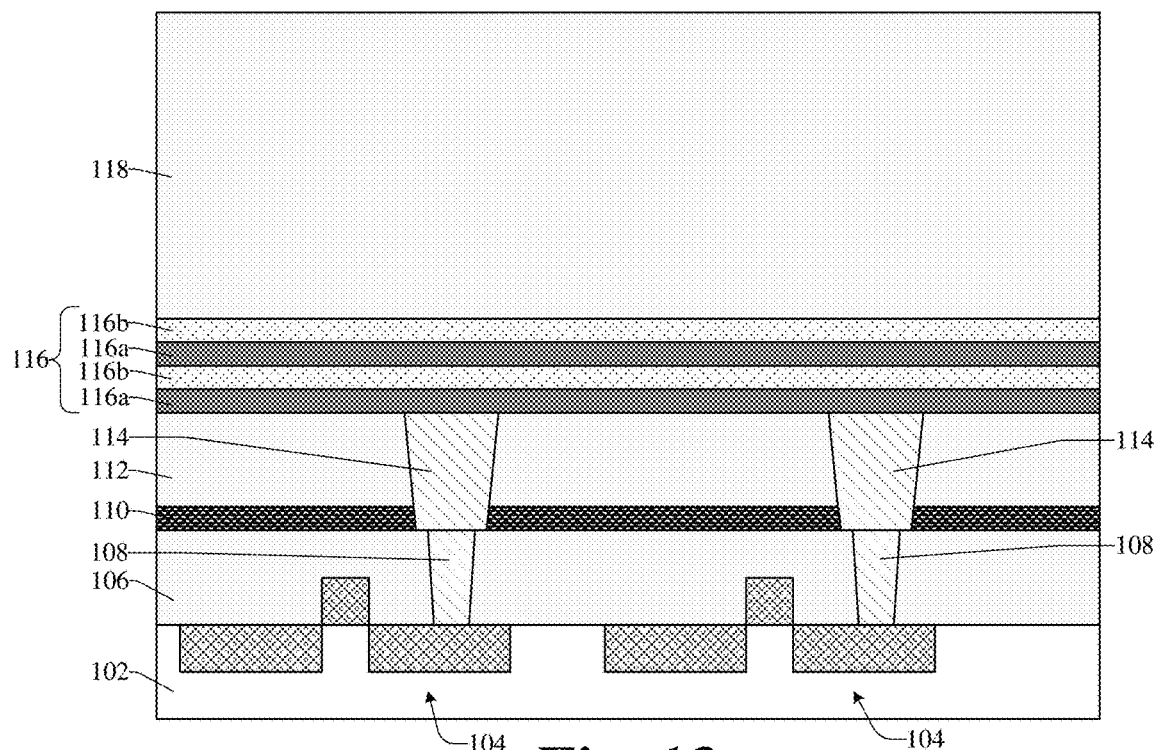

As shown in cross-sectional view 1300 of FIG. 13, a first etch-stop layer 116 is formed over the first dielectric layer 112 and over the plurality of lower wires 114, and a second dielectric layer 118 is formed over the first etch-stop layer 116.

In some embodiments, the first etch-stop layer 116 is formed by depositing a first etch-stop material 116a over the first dielectric layer 112 and subsequently depositing a second etch-stop material 116b over the first etch-stop material 116a in an alternating fashion. In some embodiments, the first etch-stop layer 116 may, for example, be formed by depositing any of silicon carbide, silicon nitride, aluminum oxide, aluminum nitride, aluminum oxynitride, or some other suitable material over the substrate 102 by any of a CVD process, a PVD process, an ALD process, a spin on process, or some other suitable process.

In some embodiments, the second dielectric layer 118 may, for example, be formed by depositing any of silicon dioxide, silicon nitride, silicon carbide, silicon oxycarbide, silicon oxycarbonitride, silicon carbonitride, silicon oxynitride, some SiOCH film, some other low-k dielectric, or some other suitable material over the substrate 102 by any of a CVD process, a PVD process, an ALD process, a spin on process, or some other suitable process.

Figure 14:
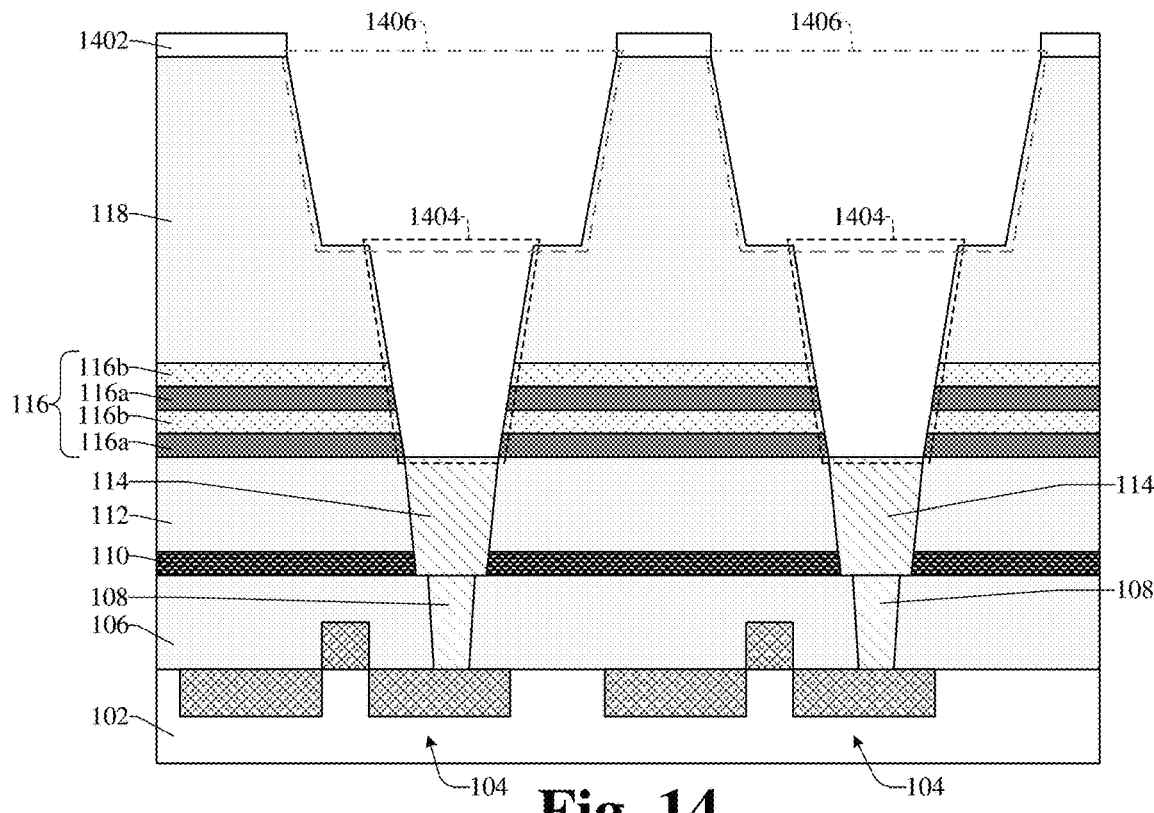

As shown in cross-sectional view 1400 of FIG. 14, a second mask 1402 is formed over the second dielectric layer 118. Further, the second dielectric layer 118 and the first etch-stop layer 116 are patterned according to the second mask 1402 to form a plurality of via openings 1404 and a plurality of upper wire openings 1406 over the plurality of lower wires 114. The plurality of via openings 1404 are defined by sidewalls of the first etch-stop layer 116, sidewalls of the second dielectric layer 118, and top surfaces of the lower wires 114. The plurality of upper wire openings 1406 are defined by sidewalls and upper surfaces of the second dielectric layer 118.

In some embodiments, the second mask 1402 may, for example, comprise any of photoresist, titanium nitride, or some other suitable material.

In some embodiments, the patterning may, for example, comprise a dry etching process or some other suitable process. For example, the patterning may comprise a RIE process, an IBE process, or some other suitable process.

In some embodiments, some misalignment (e.g., a misalignment with the second mask 1402) may occur during the patterning such that the via openings 1404 and/or the upper wire openings 1406 may be laterally offset from the lower wires 114 (see, for example, FIGS. 5-8).

In some embodiments, a height of the upper wire openings 1406 may, for example, be about 20 to 3000 angstroms or some other suitable height. In some embodiments, a height of the via openings 1404 may, for example, be about 10 to 500 angstroms or some other suitable height. In some embodiments, a width of the bottom of the via openings 1404 may, for example, be about 10 to 100 angstroms or some other suitable width. In some embodiments, a width of the upper wire openings 1406 may, for example, be about 30 to 1000 angstroms or some other suitable width. In some embodiments, a profile angle of the via openings 1404 may, for example, be about 90 to 165 degrees or some other suitable angle.

Figure 15:
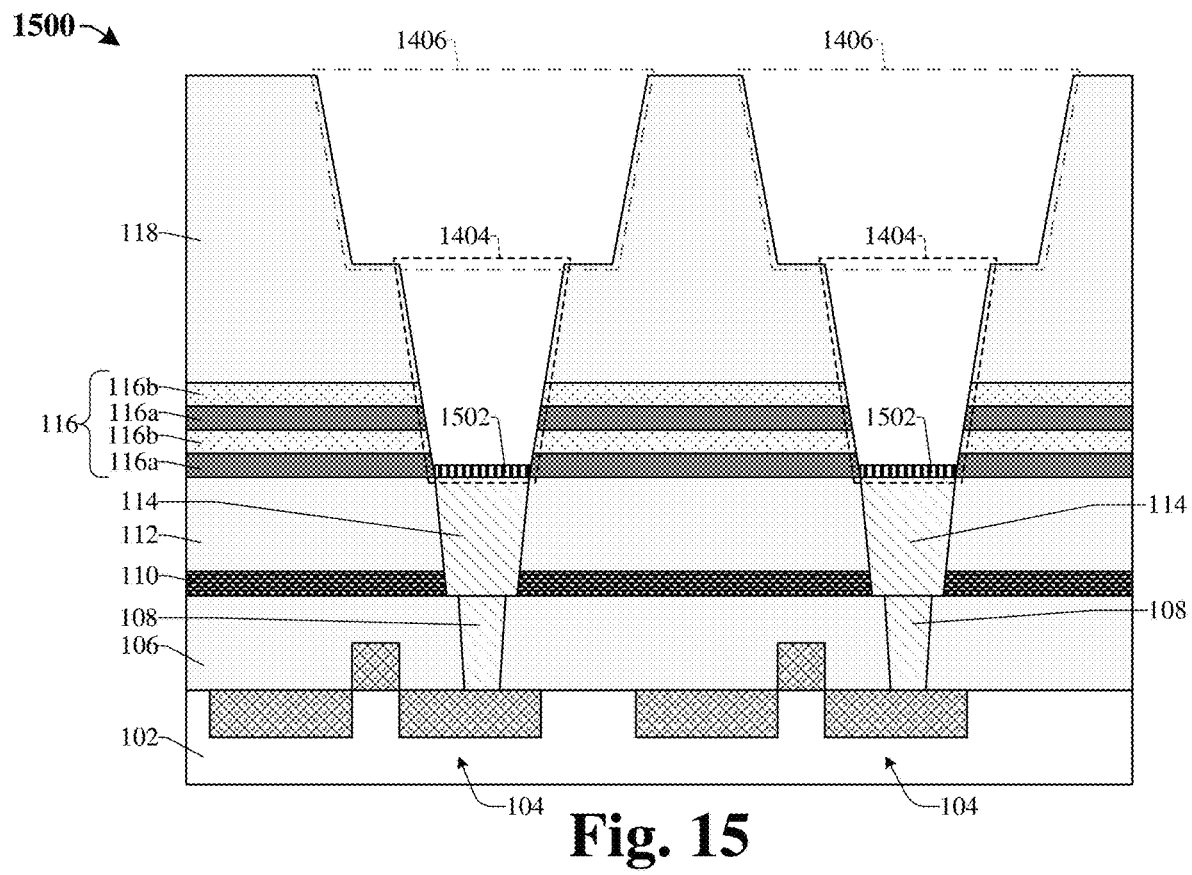

As shown in cross-sectional view 1500 of FIG. 15, a plurality of blocking layers 1502 are selectively formed on the top surfaces of the plurality of lower wires 114. For example, the plurality of blocking layers 1502 may be formed on the plurality of lower wires 114 but not on the second dielectric layer 118. In some embodiments, the plurality of blocking layers 1502 may extend along an entirety of the top surfaces of the lower wires 114.

In some embodiments, the blocking layers 1502 may, for example, comprise self-assembled monolayers (SAMs) or the like. The SAMs may be or comprise a metal complex, an organic material, or some other suitable material. For example, the SAMs may comprise benzene-1,3,5-tricarboxamide (BTA), perylenetetracarboxylic dianhydride (PTCDA), 1,4-Benzenedimethanethiol (BDMT), or some other suitable material. Further, the blocking layers 1502 may, for example, be formed by exposing the top surfaces of the lower wires 114 to a wet chemistry and/or a dry chemistry to functionalize the tops surfaces. The blocking layers 1502 (e.g., the SAMs) may prevent certain materials from being deposited on the top surfaces of the lower wires 114 during subsequent deposition processes.

Figure 16:
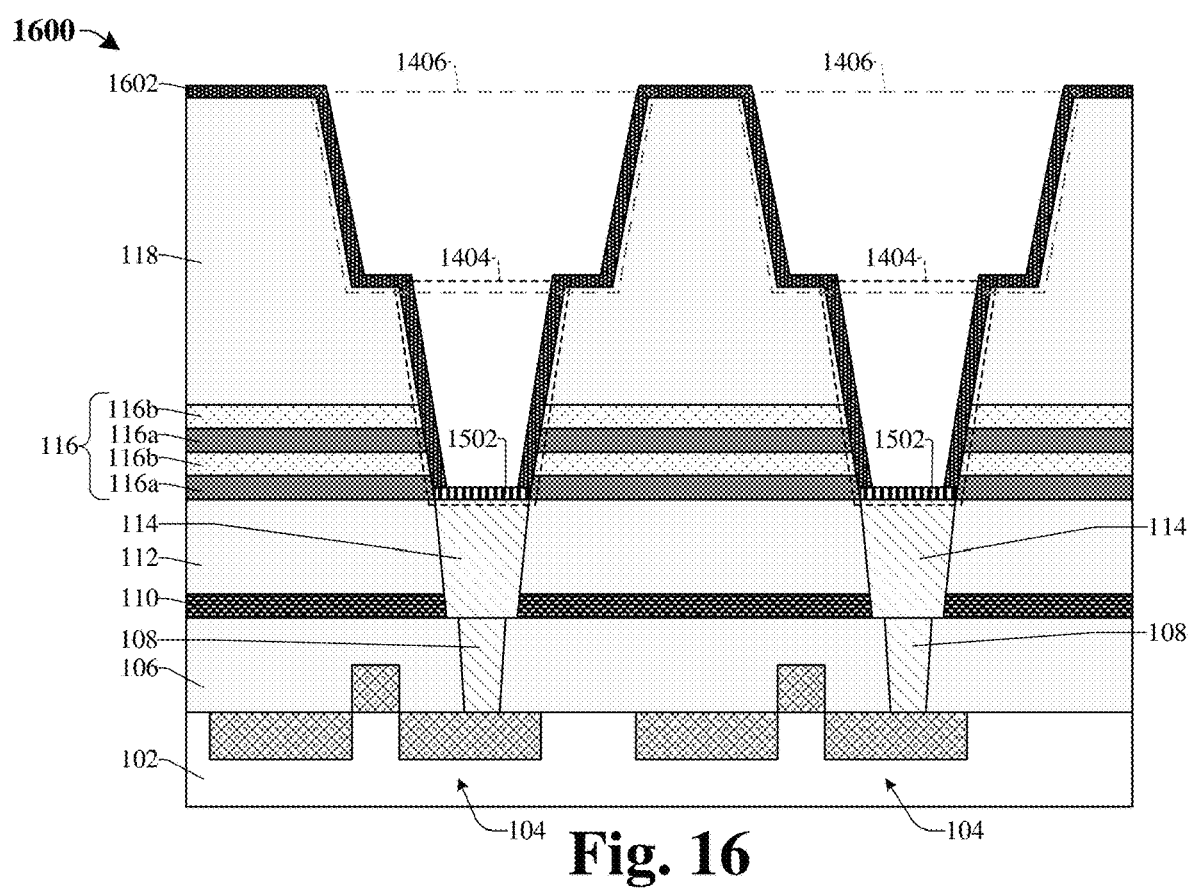

As shown in cross-sectional view 1600 of FIG. 16, a barrier precursor layer 1602 is conformally formed on second dielectric layer 118, in the plurality of upper wire openings 1406, and in the plurality of via openings 1404 such that the barrier precursor layer 1602 lines the plurality of upper wire openings 1406 and the plurality of via openings 1404. For example, the barrier precursor layer 1602 is formed on the sidewalls and the upper surfaces of the second dielectric layer 118 that define the plurality of upper wire openings 1406. Further, the barrier precursor layer 1602 is on the sidewalls of the second dielectric layer 118 and the sidewalls of the first etch-stop layer 116 that define the plurality of via openings 1404. In some embodiments, the barrier precursor layer 1602 is not formed on the top surfaces of the plurality of lower wires 114 because the plurality of blocking layers 1502 prevent the barrier precursor layer 1602 from being formed on said top surfaces.

In some embodiments, the barrier precursor layer 1602 is formed by depositing a metal-ligand material over the substrate 102 by any of a CVD process, an ALD process, or some other suitable process. For example, the metal-ligand material may comprise bis[bis(trimethylsilyl)amino]tin(II) or some other suitable material. In some embodiments, the metal of the metal-ligand material may comprise any of manganese, zinc, chromium, aluminum, silver, gold, indium, titanium, magnesium, vanadium, zirconium, tin, or some other suitable metal, and the ligand of the metal-ligand may comprise some organosilicate material. For example, the ligand may comprise any of hexamethyldisilazane (HDMS), trimethylsilylacetylene (TMSA), or some other suitable material. In some embodiments, the metal-ligand material may generally comprise a $M_xL_y$ composition, where "x" may be any number from 1 to 8 and "y" may also be any number from 1 to 8.

In some embodiments, a thickness of the barrier precursor layer 1602 is about 3 to 100 angstroms, about 3 to 50 angstroms, or some other suitable value.

In some embodiments, the barrier precursor layer 1602 may be formed on top surfaces of the second dielectric layer 118 due an offset between the via openings and the lower wires 114 (see, for example, FIGS. 5-8).

As shown in cross-sectional view 1700 of FIG. 17, a dielectric liner layer 1702 is formed over the barrier precursor layer 1602, in the plurality of upper wire openings 1406, and in the plurality of via openings 1404 such that the dielectric liner layer 1702 lines the barrier precursor layer 1602. For example, the dielectric liner layer 1702 is formed on sidewalls of the barrier precursor layer 1602, and on upper surfaces of the barrier precursor layer 1602. In some embodiments, dielectric liner layer 1702 is not formed on the top surfaces of the plurality of lower wires 114 because the blocking layers 1502 prevent the dielectric liner layer 1702 from being formed on said top surfaces.

In some embodiments, the dielectric liner layer 1702 may, for example, be formed by depositing any of silicon dioxide, silicon nitride, silicon carbide, silicon oxycarbide, silicon oxycarbonitride, silicon carbonitride, silicon oxynitride, some SiOCH film, some other low-k dielectric, or some other suitable material over the substrate 102 by any of a CVD process, a PVD process, an ALD process, a spin on process, or some other suitable process.

In some embodiments, a thickness of the dielectric liner layer 1702 is about 3 to 100 angstroms, about 3 to 50 angstroms, or some other suitable value.

In some embodiments, the formation of the blocking layers 1502 may be tuned such that the blocking layers 1502 are not formed along edges of the lower wires 114. Thus, in some embodiments, the barrier precursor layer 1602 and/or the dielectric liner layer 1702 may be formed on the top surfaces of the lower wires 114 (see, for example, FIGS. 1 and 2).

As shown in cross-sectional view 1800 of FIG. 18, a plasma pre-clean process is performed on the dielectric liner layer 1702, the barrier precursor layer 1602, the plurality of blocking layers 1502, and the top surfaces of the plurality of lower wires 114. The plasma pre-clean process removes the plurality of blocking layers 1502 from the top surfaces of the plurality of lower wires 114. Further, the plasma pre-clean process dissociates the metal-ligand material of the barrier precursor layer 1602. The dissociated metal and ligands react with the dielectric liner layer 1702 to form a hybrid barrier layer 120 from the barrier precursor layer 1602 and the dielectric liner layer 1702. For example, the metal, ligand(s), and dielectric may react to form a compound that includes tin, silicon dioxide, and bis(trimethylsilyl)amine.

In some embodiments, the plasma pre-clean process comprises a surface treatment process which exposes the second dielectric layer 118 and the top surfaces of the lower wires 114 to a plasma in order to remove any residue or other impurities from the via openings 1404 and/or the top surfaces of the lower wires 114 before proceeding.

In some embodiments, a power applied during the plasma pre-clean process may, for example, be about 30 to 900 watts or some other suitable value. In some embodiments, the process may, for example, be performed for about 1 to 86400 seconds or some other suitable time period. In some embodiments, a temperature during the process may, for example, be about 50 to 450 degrees Celsius or some other suitable temperature.

In some embodiments, the metal-ligand material may alternatively be dissociated by a thermal treatment process. Further, in some embodiments, the blocking layers 1502 may alternatively be removed by a thermal treatment process.

In some embodiments, the plasma pre-clean process may damage the second dielectric layer 118 (e.g., may create voids along and/or within the second dielectric layer 118). Further, the dissociated ligands from the metal-ligand material may react with the second dielectric layer 118 and may repair damage caused to the second dielectric layer 118 by the plasma pre-clean process (e.g., the ligands may fill the voids along and/or within the second dielectric layer 118). Thus, a reliability of the second dielectric layer 118 may be maintained.

In some embodiments, a thickness of the hybrid barrier layer 120 is approximately equal to a combined thickness of the barrier precursor layer (e.g., 1602 of FIG. 16) and the dielectric liner layer (e.g., 1702 of FIG. 17).

In some embodiments, the metal from the metal-ligand may diffuse slowly into the dielectric liner layer 1702. Thus, the metal composition of the hybrid barrier layer 120 may be gradient. In some other embodiments, the metal may diffuse quickly into the dielectric liner layer 1702. Thus, the metal composition of the hybrid barrier layer 120 may be approximately uniform.

Figure 19:
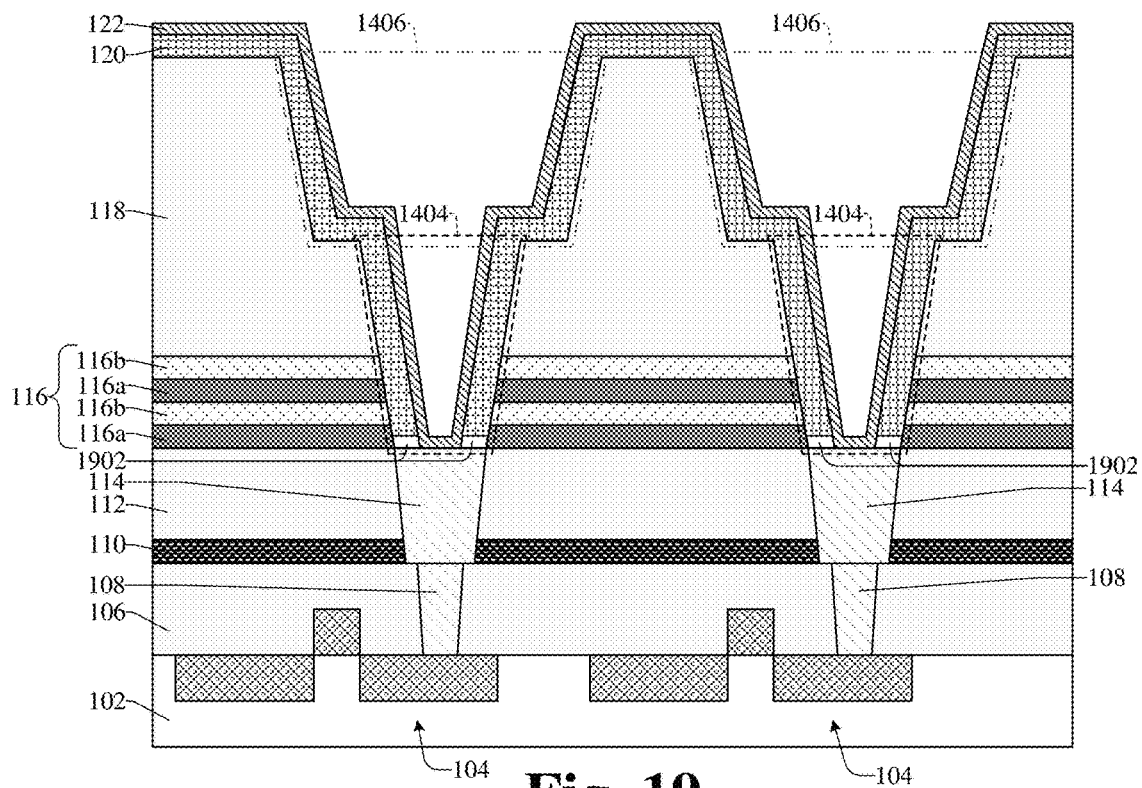

As shown in cross-sectional view 1900 of FIG. 19, a liner layer 122 is formed over the hybrid barrier layer 120, in the plurality of via openings 1404, and in the plurality of upper wire openings 1406 such that that liner layer 122 lines the hybrid barrier layer 120. For example, the liner layer 122 is formed on sidewalls of the hybrid barrier layer 120, upper surfaces of the hybrid barrier layer 120, and the top surfaces of the plurality of lower wires 114.

In some embodiments, the liner layer 122 is formed by depositing any of cobalt, ruthenium, manganese, zinc, zirconium, tungsten, molybdenum, osmium, iridium, aluminum, iron, nickel, or some other suitable material over the substrate 102 by any of an ELD process, an ECP process, a CVD process, a PVD process, an ALD process, or some other suitable process.

In some embodiments, a thickness of the liner layer 122 is about 3 to 100 angstroms, about 3 to 50 angstroms, or some other suitable value.

In some embodiments, cavities 1902 may exist vertically between the hybrid barrier layer 120 and the lower wires 114 (e.g., where the blocking layers 1502 were previously arranged) after the liner layer 122 is formed. In some other embodiments, the liner layer may 122 may fill the cavities 1902 when the liner layer 122 is formed such that the liner layer 122 extends vertically between the hybrid barrier layer 120 and the lower wires 114 (see, for example, FIG. 4).

Figure 20:
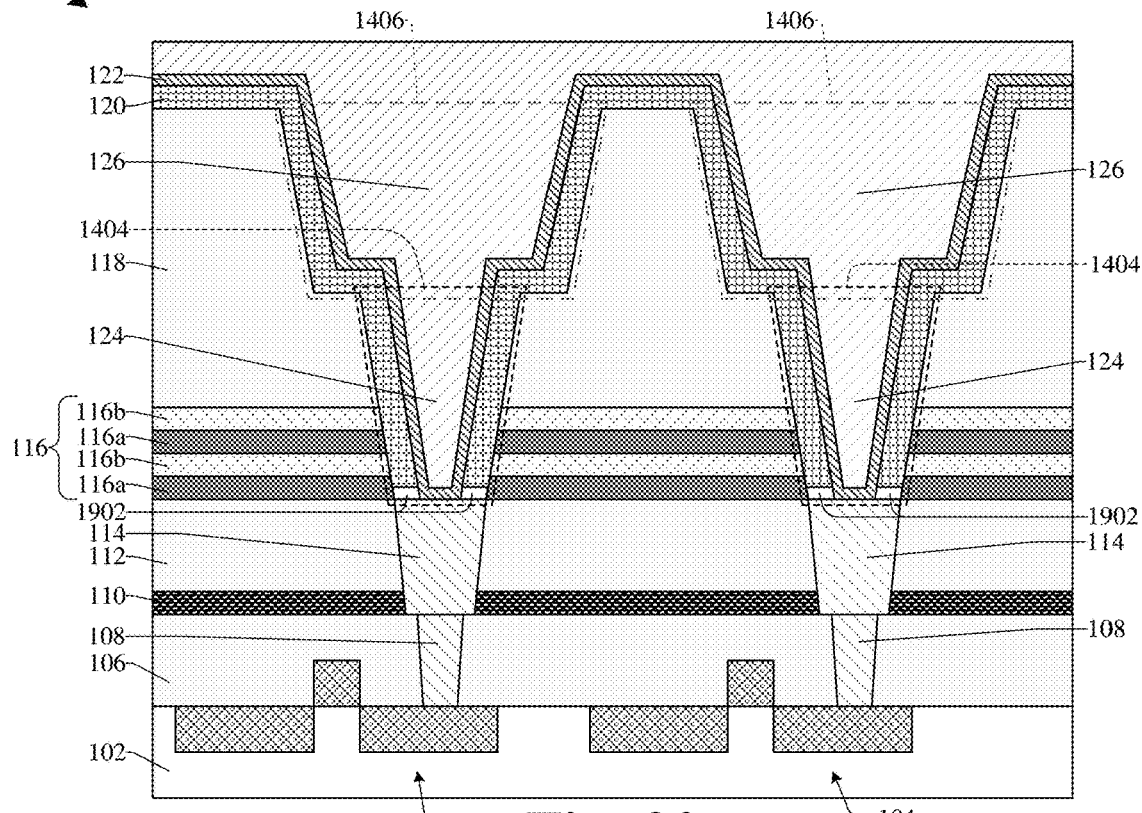

As shown in cross-sectional view 2000 of FIG. 20, a plurality of vias 124 and a plurality of upper wires 126 are formed over the liner layer 122 in the remainder of the via openings 1404 and the remainder of the upper wire openings 1406 such that the plurality of vias 124 fill the plurality of via openings 1404 and the plurality of upper wires 126 fill the plurality of upper wire openings 1406.

In some embodiments, the plurality of vias 124 and the plurality of upper wires 126 may, for example, be formed by depositing any of copper, cobalt, tungsten, ruthenium, molybdenum, some other metal, graphene, or some other conductive material over the substrate 102 by any of a sputtering process, an electro-chemical plating (ECP) process, an electroless deposition (ELD) process, a CVD process, a PVD process, an ALD process, or some other suitable process.

In some embodiments, an aspect ratio of the vias 124 and/or of the upper wires 126 may, for example, be about 1 to 35 or some other suitable value. For example, in some embodiments, a height of the vias 124 and/or of the upper wires 126 may be between about 1 to about 35 times greater than a width of the vias 124 and/or upper wires 126, respectively.

Although FIGS. 13-21 illustrate a dual damascene process, it will be appreciated that in some alternative embodiments, a single damascene process is also feasible (see, for example, FIGS. 7 and 8).

Figure 21:
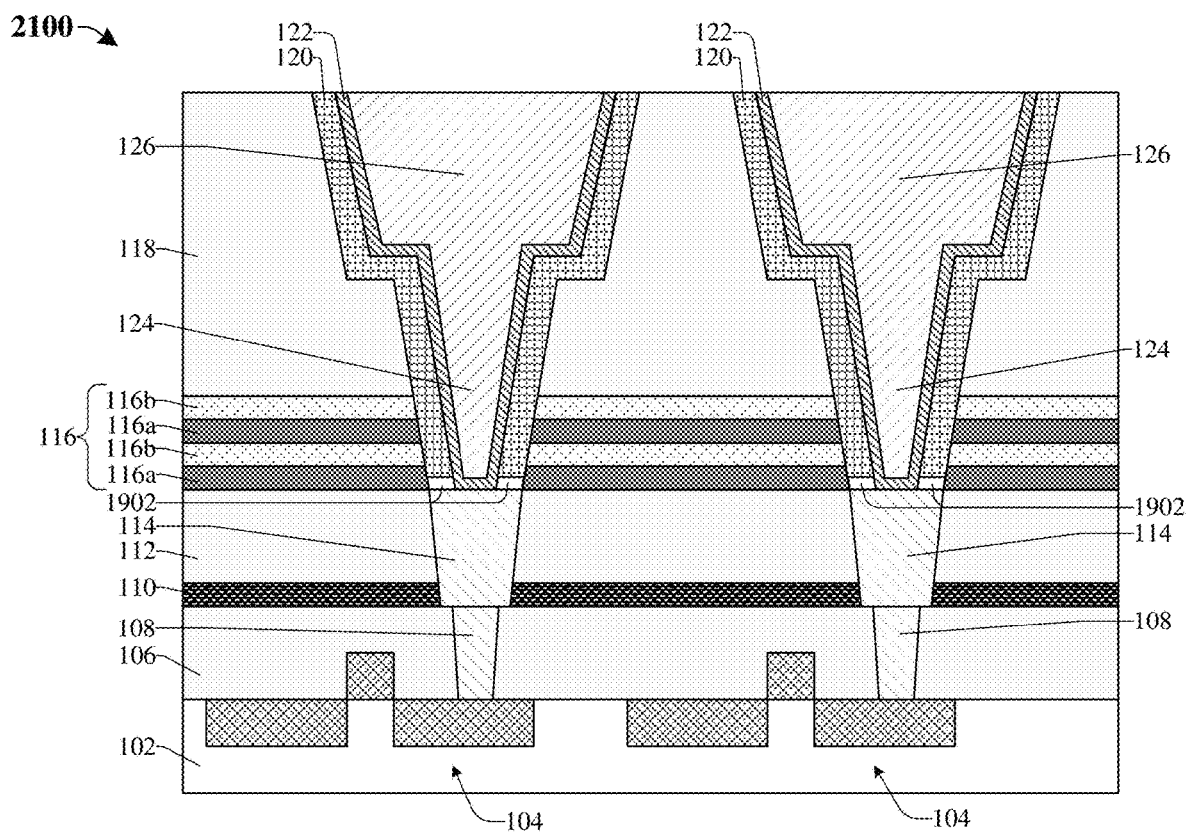

As shown in cross-sectional view 2100 of FIG. 21, a planarization process is performed on the upper wires 126, the liner layer 122, and the hybrid barrier layer 120. In some embodiments, the planarization process may also be formed on the second dielectric layer 118. As a result of the planarization process, the upper wires 126, the liner layer 122, and the hybrid barrier layer 120 are removed from over a top surface of the second dielectric layer 118. Further, as a result of the planarization process, the plurality of upper wires 126, the liner layer 122, and the hybrid barrier layer 120 may have approximately coplanar top surfaces.

In some embodiments, the planarization process may, for example, be or comprise a chemical mechanical planarization (CMP) or some other suitable process.

Figure 22:
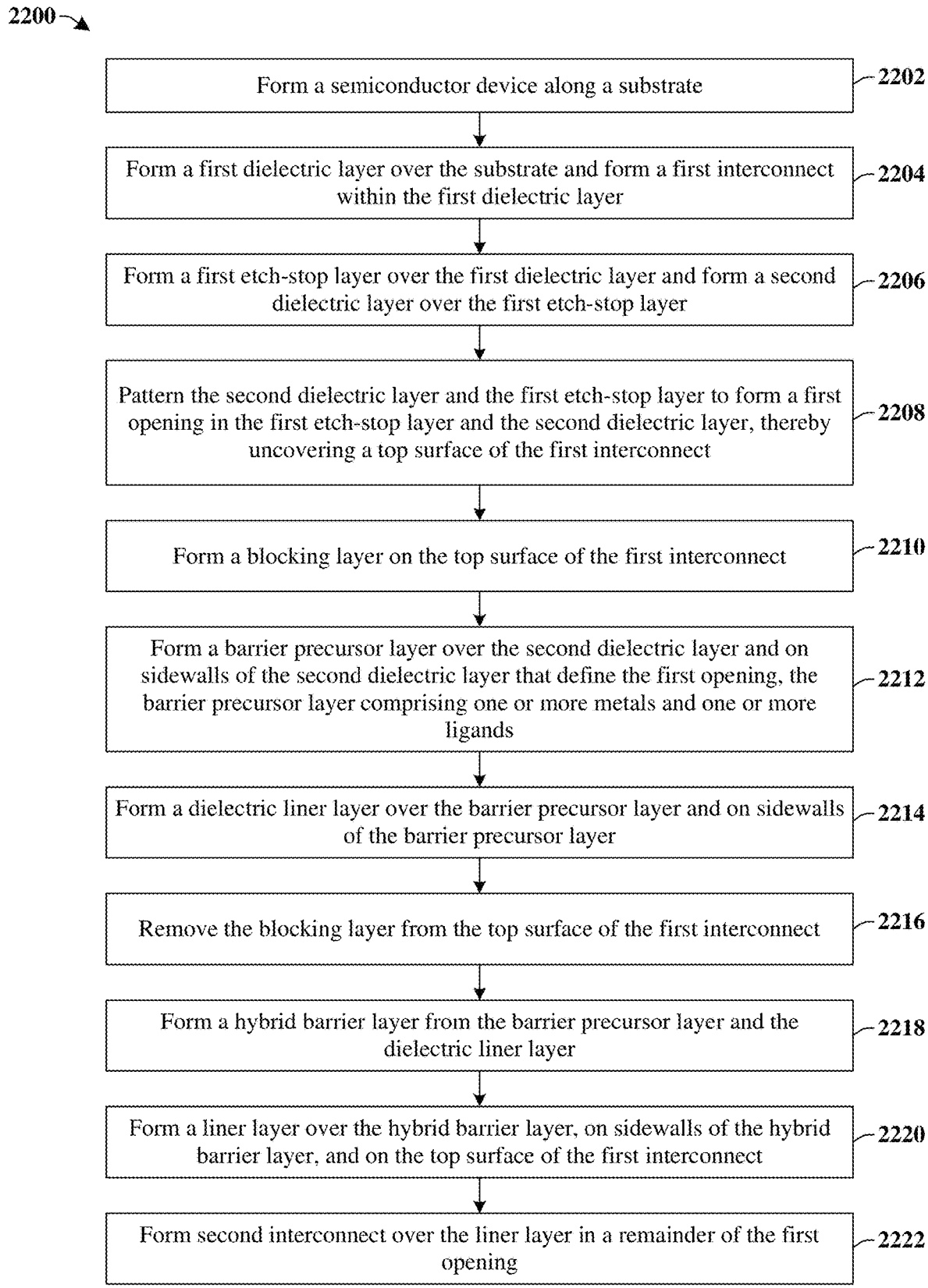
FIG. 22 illustrates a flow diagram of some embodiments of a method for forming an integrated chip comprising a hybrid barrier layer that extends along a via.

FIG. 22 illustrates a flow diagram of some embodiments of a method 2200 for forming an integrated chip comprising a hybrid barrier layer that extends along a via. While method 2200 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2202, a semiconductor device is formed along a substrate. FIG. 9 illustrates a cross-sectional view 900 of some embodiments corresponding to act 2202.

At 2204, a first dielectric layer is formed over the substrate and a first interconnect is formed within the first dielectric layer. FIGS. 10, 11, and 12 illustrate cross-sectional views 1000, 1100, and 1200 of some embodiments corresponding to act 2204.

At 2206, a first etch-stop layer is formed over the first dielectric layer and a second dielectric layer is formed over the first etch-stop layer. FIG. 13 illustrates a cross-sectional view 1300 of some embodiments corresponding to act 2206.

At 2208, the second dielectric layer and the first etch-stop layer are patterned to form a first opening in the first etch-stop layer and the second dielectric layer, thereby uncovering a top surface of the first interconnect. FIG. 14 illustrates a cross-sectional view 1400 of some embodiments corresponding to act 2208.

At 2210, a blocking layer is formed on the top surface of the first interconnect. FIG. 15 illustrates a cross-sectional view 1500 of some embodiments corresponding to act 2210.

At 2212, a barrier precursor layer is formed over the second dielectric layer and on sidewalls of the second dielectric layer that define the first opening. The barrier precursor layer comprises one or more metals and one or more ligands. FIG. 16 illustrates a cross-sectional view 1600 of some embodiments corresponding to act 2212.

At 2214, a dielectric liner layer is formed over the barrier precursor layer and on sidewalls of the barrier precursor layer. FIG. 17 illustrates a cross-sectional view 1700 of some embodiments corresponding to act 2214.

At 2216, the blocking layer is removed from the top surface of the first interconnect. FIG. 18 illustrates a cross-sectional view 1800 of some embodiments corresponding to act 2216.

At 2218, a hybrid barrier layer is formed from the barrier precursor layer and the dielectric liner layer. FIG. 18 illustrates a cross-sectional view 1800 of some embodiments corresponding to act 2218.

At 2220, a liner layer is formed over the hybrid barrier layer, on sidewalls of the hybrid barrier layer, and on the top surface of the first interconnect. FIG. 19 illustrates a cross-sectional view 1900 of some embodiments corresponding to act 2220.

At 2222, a second interconnect is formed over the liner layer in a remainder of the first opening. FIG. 20 illustrates a cross-sectional view 2000 of some embodiments corresponding to act 2222.

Thus, the present disclosure relates to an integrated chip comprising a hybrid barrier layer for improving a performance of the integrated chip, and to a method for forming the integrated chip.

Accordingly, in some embodiments, the present disclosure relates to an integrated chip comprising a lower conductive wire within a first dielectric layer over a substrate. A second dielectric layer is over the first dielectric layer. A conductive via is over the lower conductive wire and within the second dielectric layer. A conductive liner layer lines sidewalls of the via. A barrier layer lines sidewalls of the conductive liner layer and lines sidewalls of the second dielectric layer. The conductive liner layer is laterally separated from the second dielectric layer by the barrier layer. The conductive liner layer vertically extends between sidewalls of the barrier layer from a bottom surface of the conductive via to a top surface of the lower conductive wire.

In other embodiments, the present disclosure relates to an integrated chip comprising a lower metal wire within a first dielectric layer over a substrate. A second dielectric layer is over the first dielectric layer. A metal via is over the lower metal wire and within the second dielectric layer. A metal liner layer lines sidewalls of the metal via and a bottom surface of the metal via. The metal liner layer is on a top surface of the lower metal wire and on the bottom surface of the metal via. A hybrid barrier layer is between sidewalls of the metal liner layer and sidewalls of the second dielectric layer. The hybrid barrier layer comprises a metal, a dielectric, and a ligand. The second dielectric layer comprises the ligand.

In yet other embodiments, the present disclosure relates to a method for forming an integrated chip. The method comprises forming a second dielectric layer over a first dielectric layer and over a lower metal wire within the first dielectric layer. The second dielectric layer is patterned to form an interconnect opening over the lower metal wire. The interconnect opening is defined by sidewalls of the second dielectric layer. The patterning exposes a top surface of the lower metal wire. A blocking layer is formed on the top surface of the lower metal wire. A barrier precursor layer is formed on the sidewalls of the second dielectric layer. The barrier precursor layer comprises a metal-ligand material. A dielectric liner layer is formed on sidewalls of the barrier precursor layer. The blocking layer is removed from the top surface of the lower metal wire. A hybrid barrier layer is formed from the barrier precursor layer and the dielectric liner layer. A conductive liner layer is formed on the top surface of the lower metal wire and lining sidewalls of the hybrid barrier layer. A metal is deposited over the conductive liner layer in the interconnect opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated chip, the method comprising:
  forming a second dielectric layer over a first dielectric layer and over a lower metal wire within the first dielectric layer;
  patterning the second dielectric layer to form an interconnect opening over the lower metal wire, wherein the interconnect opening is defined by sidewalls of the second dielectric layer, and wherein the patterning exposes a top surface of the lower metal wire;
  forming a blocking layer on the top surface of the lower metal wire;
  forming a barrier precursor layer on the sidewalls of the second dielectric layer, the barrier precursor layer comprising a metal-ligand material;
  forming a dielectric liner layer on sidewalls of the barrier precursor layer;
  removing the blocking layer from the top surface of the lower metal wire;
  forming a hybrid barrier layer from the barrier precursor layer and the dielectric liner layer;
  forming a conductive liner layer on the top surface of the lower metal wire and lining sidewalls of the hybrid barrier layer; and
  depositing a metal over the conductive liner layer in the interconnect opening.

2. The method of claim 1, wherein removing the blocking layer and forming the hybrid barrier layer comprises performing a plasma pre-clean process on the blocking layer, the barrier precursor layer, and the dielectric liner layer.

3. The method of claim 2, wherein the plasma pre-clean process dissociates the metal-ligand material, thereby forming a dissociated metal and one or more dissociated ligands.

4. The method of claim 3, wherein the plasma pre-clean process creates one or more voids in the second dielectric layer, and wherein one or more of the one or more dissociated ligands fill the one or more voids.

5. The method of claim 3, wherein the dissociated metal and the one or more dissociated ligands react with the dielectric liner layer to form the hybrid barrier layer.

6. The method of claim 1, wherein removing the blocking layer and forming the hybrid barrier layer comprises performing a thermal treatment process on the blocking layer, the barrier precursor layer, and the dielectric liner layer.

7. The method of claim 1, wherein the blocking layer prevents the barrier precursor layer and the dielectric liner layer from being deposited on the top surface of the lower metal wire.

8. The method of claim 1, wherein the barrier precursor layer and the dielectric liner layer are formed over the blocking layer, and wherein the removing of the blocking layer from the top surface of the lower metal wire removes the blocking layer from under the barrier precursor layer and from under the dielectric liner layer.

9. The method of claim 1, wherein removing the blocking layer and forming the hybrid barrier layer comprises exposing the dielectric liner layer and the blocking layer to a plasma.

10. A method for forming an integrated chip, the method comprising:
   forming a lower metal wire within a first dielectric layer;
   depositing a second dielectric layer over the first dielectric layer and over the lower metal wire;
   patterning the second dielectric layer to form an interconnect opening in the second dielectric layer over the lower metal wire, wherein the interconnect opening is between sidewalls of the second dielectric layer and uncovers a top surface of the lower metal wire;
   forming a blocking layer on the top surface of the lower metal wire;
   depositing a barrier precursor layer along the sidewalls of the second dielectric layer;
   depositing a dielectric liner layer along sidewalls of the barrier precursor layer;
   removing the blocking layer from the top surface of the lower metal wire;
   forming a hybrid barrier layer from the barrier precursor layer and the dielectric liner layer;
   depositing a conductive liner layer over the lower metal wire and along sidewalls of the hybrid barrier layer; and
   depositing a metal over the conductive liner layer.

11. The method of claim 10, wherein removing the blocking layer and forming the hybrid barrier layer comprises performing a plasma pre-clean process on the blocking layer, the barrier precursor layer, and the dielectric liner layer.

12. The method of claim 10, wherein the barrier precursor layer comprises a metal-ligand material.

13. The method of claim 12, further comprising:
   dissociating the metal-ligand material, thereby forming a dissociated metal and a dissociated ligand from the barrier precursor layer.

14. The method of claim 13, wherein the dissociated metal and the dissociated ligand react with the dielectric liner layer to form the hybrid barrier layer.

15. The method of claim 10, wherein the blocking layer comprises a self-assembled monolayer, and wherein the blocking layer prevents the barrier precursor layer and the dielectric liner layer from being deposited on the top surface of the lower metal wire.

16. The method of claim 10, wherein the barrier precursor layer is formed over the blocking layer and the dielectric liner layer is formed over the blocking layer, and wherein the removing of the blocking layer from the top surface of the lower metal wire removes the blocking layer from under the barrier precursor layer and from under the dielectric liner layer.

17. A method for forming an integrated chip, the method comprising:
   forming a lower metal wire within a first dielectric layer;
   depositing a second dielectric layer over the first dielectric layer and over the lower metal wire;
   etching the second dielectric layer to form an interconnect opening in the second dielectric layer over the lower metal wire, wherein the interconnect opening is delimited by sidewalls of the second dielectric layer and uncovers a top surface of the lower metal wire;
   forming a blocking layer on the top surface of the lower metal wire;
   depositing a barrier precursor layer on the sidewalls of the second dielectric layer;
   depositing a dielectric liner layer on sidewalls of the barrier precursor layer;
   performing a plasma cleaning process on the dielectric liner layer, the barrier precursor layer, and the blocking layer to remove the blocking layer from the top surface of the lower metal wire and to form a hybrid barrier layer along the sidewalls of the second dielectric layer from the barrier precursor layer and the dielectric liner layer;
   depositing a conductive liner layer over the lower metal wire and on sidewalls of the hybrid barrier layer; and
   depositing a metal over the conductive liner layer and in a remainder of the interconnect opening to form an upper metal wire over the lower metal wire.

18. The method of claim 17, wherein the barrier precursor layer comprises a compound including two components, wherein the plasma cleaning process separates the two components.

19. The method of claim 18, wherein the plasma cleaning process creates a void in the second dielectric layer, and wherein one of the two components of the barrier precursor layer fills the one or more voids.

20. The method of claim 17, wherein performing the plasma cleaning process comprises exposing the exposing the dielectric liner layer, the barrier precursor layer, and the blocking layer to a plasma.

* * * * *